United States Patent
Ma et al.

(10) Patent No.: US 7,411,271 B1
(45) Date of Patent: Aug. 12, 2008

(54) COMPLEMENTARY METAL-OXIDE-SEMICONDUCTOR FIELD EFFECT TRANSISTOR

(75) Inventors: Shih-Kuei Ma, Hsinchu (TW);
Chung-Yeh Lee, Hsinchu (TW);
Chun-Ying Yeh, Hsinchu (TW);
Shin-Cheng Lin, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 34 days.

(21) Appl. No.: 11/624,694

(22) Filed: Jan. 19, 2007

(51) Int. Cl.
*H01L 29/00* (2006.01)
(52) U.S. Cl. .................. 257/547; 257/546; 257/545
(58) Field of Classification Search ................ 257/545, 257/546, 547, 548, 549, 550, 554, 555
See application file for complete search history.

(56) References Cited

U.S. PATENT DOCUMENTS

| | | | |
|---|---|---|---|
| 3,648,128 A * | 3/1972 | Kobayashi | ................... 257/547 |
| 3,649,887 A | 3/1972 | Keller et al. | |
| 3,931,634 A | 1/1976 | Knight | |
| 4,027,365 A | 6/1977 | Froeliger | |
| 4,466,011 A | 8/1984 | Van Zanten | |
| 4,890,149 A | 12/1989 | Bertotti et al. | |
| 5,021,860 A | 6/1991 | Bertotti et al. | |
| 5,243,214 A | 9/1993 | Sin et al. | |
| 5,495,123 A | 2/1996 | Canclini | |

* cited by examiner

*Primary Examiner*—Marvin M. Lateef
*Assistant Examiner*—William A Harriston
(74) *Attorney, Agent, or Firm*—Jianq Chyun IP Office

(57) ABSTRACT

A complementary metal-oxide-semiconductor field effect transistor (CMOSFET) is provided. The CMOSFET includes a substrate of a first conductivity type, a first epitaxial layer, a well, a second epitaxial layer of a second conductivity type, a first sinker, a second sinker, a first buried layer and a second buried layer. The first and the second epitaxial layer are sequentially disposed on the substrate. The first sinker and the first buried layer separate a first region from the second epitaxial layer. The second sinker and the second buried layer separate a second region from the second epitaxial layer. The well is disposed in the first region. A first transistor is disposed in the well. A second transistor is disposed in the second region. A deep trench isolation is disposed between the first and the second region and extends from the substrate to the upper surface of the second epitaxial layer.

8 Claims, 2 Drawing Sheets

COMPLEMENTARY METAL-OXIDE-SEMICONDUCTOR FIELD EFFECT TRANSISTOR

BACKGROUND OF THE INVENTION

1. Field of the Invention

The present invention relates to a semiconductor device, and more particularly to a semiconductor device capable of preventing latch-up.

2. Description of Related Art

The design of a semiconductor device must continuously improve with the increasing level of integration and the increasingly complicated requirements. For example, the design of high-voltage devices must be strong enough to withstand high voltage operation while not affecting the operation of other devices. In the following, the problems and limitation of a conventional high voltage device is described with reference to FIG. 1.

FIG. 1 is a schematic cross-sectional view of a conventional high voltage device. The high voltage device is a complementary metal-oxide-semiconductor field effect transistor (CMOSFET) comprising two lateral double-diffused metal-oxide-semiconductor field effect transistors (LDMOS-FET).

As shown in FIG. 1, the high voltage device includes a P-type substrate (P-sub) 100, gates 102 and 104, gate dielectric layers 106 and 108, a P-well 112p, a P-tub 114p, doped regions 116p, 118p and 120p, N-tubs 112n and 124n, doped regions 126n, 128n and 130n, an isolation 134, a dielectric layer 136, interconnects 138 and a dielectric layer 140. The P-type substrate 100 can be divided into a HVNMOSFET region and a HVPMOSFET region comprising a high voltage N-type MOSFET (NMOSFET) and a high voltage P-type MOSFET (PMOSFET), respectively. The doped regions 126n, 128n and the gate 102 are the source, the drain and the gate of the high voltage NMOSFET, and the doped regions 120p, 118p and the gate 104 are the source, the drain and the gate of the high voltage PMOSFET. The doped regions 116p, 118p and 120p have p+ conductivity type and the doped regions 126n, 128n and 130n have n+ conductivity type.

However, the high voltage device in FIG. 1 may have the following drawbacks:

1. The high voltage device may have latch-up problem. More specifically, the doped region 120p, the N-tub 124n and the P-type substrate 100 may form the emitter, the base and the collector of a parasitic bipolar transistor, and the doped region 126n, the P-type substrate 100 and the N-tub 124n may form the emitter, the base and the collector of another parasitic bipolar transistor. When the current/gain product of the two bipolar transistors is greater than 1, the high voltage device cannot operate normally.

2. The foregoing high voltage PMOS and the high voltage NMOS are disposed on the P-type substrate 100. Since the input voltage applied to the doped region 120p is directly applied to the P-type substrate 100, the input voltage is subjected to considerable limitations so that the operating range of the high voltage device is reduced.

3. In general, other semiconductor devices are also disposed on the P-type substrate 100. However, none of the sides of the high voltage device have provided sufficient isolation. Therefore, mutual interference between the high voltage device and these semiconductor devices may occur.

Since the operation of the CMOSFET may affect the operations of other semiconductor devices disposed above the substrate, the design must be improved.

SUMMARY OF THE INVENTION

Accordingly, the present invention is directed to a semiconductor device capable of minimizing input voltage limitation problem and preventing mutual interference with other semiconductor devices.

The present invention is also directed to a CMOSFET capable of improving latch-up in the device.

As embodied and broadly described herein, the present invention provides a CMOSFET including a substrate, a first epitaxial layer, a second epitaxial layer, a first sinker, a second sinker, a well, a first transistor, a second transistor, a first buried layer, a second buried layer and a deep trench isolation. The substrate has a first conductivity type. The first epitaxial layer has the first conductivity type and is disposed on the substrate. The second epitaxial layer has a second conductivity type and is disposed on the first epitaxial layer. The first sinker has the second conductivity type and is disposed in the second epitaxial layer. The first sinker extends from the first epitaxial layer to the upper surface of the second epitaxial layer. The first sinker separates a first region from the second epitaxial layer. The second sinker has the second conductivity type and is disposed in the second epitaxial layer. The second sinker extends from the first epitaxial layer to the upper surface of the second epitaxial layer. The second sinker separates a second region from the second epitaxial layer outside the first region. The well has the second conductivity type and is disposed inside the first region. The first transistor is disposed in the well and the second transistor is disposed in the second region. The first buried layer has the second conductivity type. The first buried layer is disposed between the first region and the first epitaxial layer and electrically connected to the first sinker. The second buried layer has the second conductivity type. The second buried layer is disposed between the second region and the first epitaxial layer and electrically connected to the second sinker. The deep trench isolation is disposed between the first region and the second region and extends from the substrate to the upper surface of the second epitaxial layer.

In one embodiment of the present invention, the material of the foregoing deep trench isolation includes dielectric material, polysilicon, doped polysilicon, metal or titanium/titanium nitride/tungsten composite, for example.

In one embodiment of the present invention, a metal silicide layer is also disposed between the foregoing deep trench isolation and the substrate. The material of the metal silicide layer includes titanium silicide, nickel silicide, cobalt silicide or tungsten silicide, for example.

In one embodiment of the present invention, the dopant concentration of the foregoing first buried layer and the second buried layer is higher than the dopant concentration of the second epitaxial layer, for example.

In one embodiment of the present invention, the foregoing first transistor and the second transistor are high voltage MOSFET, for example.

In one embodiment of the present invention, the foregoing first conductivity type is P-type and the second conductivity type is N-type. In another embodiment of the present invention, the foregoing first conductivity type is N-type and the second conductivity type is P-type.

In brief, the present invention with the aforementioned design is capable of preventing latch-up problem. Furthermore, the CMOSFET in the present invention can be effectively isolated from external devices and hence a wider input voltage range can be tolerated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
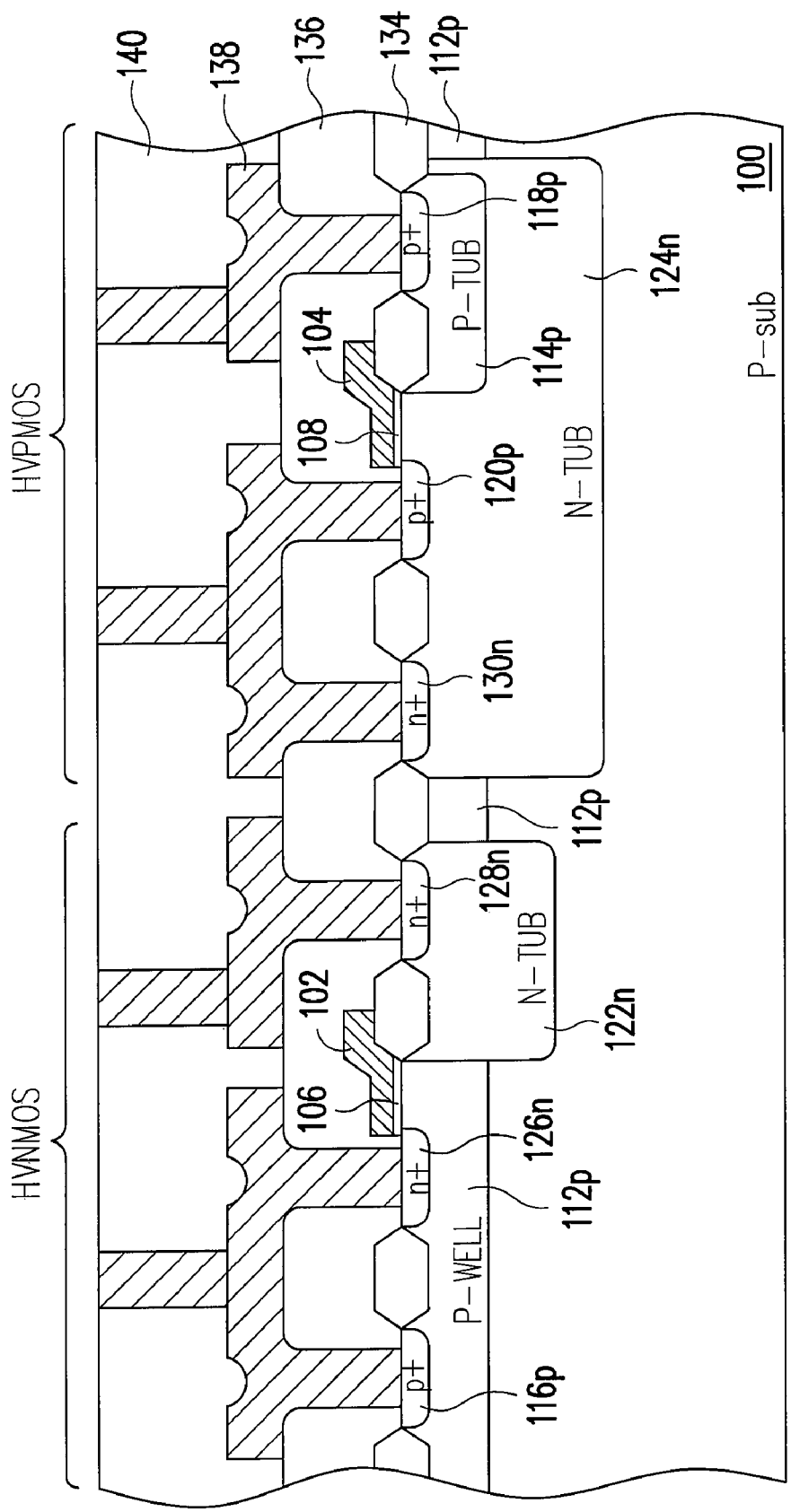
FIG. 1 is a schematic cross-sectional view of a conventional high voltage device.

Reference will now be made in detail to the present preferred embodiments of the invention, examples of which are illustrated in the accompanying drawings. Wherever possible, the same reference numbers are used in the drawings and the description to refer to the same or like parts.

To improve the conventional CMOSFET, the CMOSFET is disposed in an epitaxial layer on a substrate. More specifically, the epitaxial layer may include a first epitaxial layer and a second epitaxial layer starting from the substrate. The first epitaxial layer and the substrate have the same conductivity type while the second epitaxial layer and the substrate have opposite conductivity types. The first epitaxial layer and the second epitaxial layer may provide a diode rectifying function to prevent carriers from injecting into the substrate. Furthermore, since the dopant concentration of the substrate may be greater than the first epitaxial layer and the substrate may be grounded, the substrate provides a lower impedance pathway for disposing the extra carriers. Therefore, the carrier is prevented from affecting other semiconductor devices on the substrate.

In addition, the present invention uses two sinkers and two buried layers to separate the second epitaxial layer into two regions and disposes the two transistors of the CMOSFET in the two regions respectively. Through the foregoing design arrangement, the parasitic diode or parasitic transistor can be modified. On the other hand, adjusting the voltage of the buried layers can prevent the input voltage applied to the CMOSFET from being totally applied to the substrate. This can widen the operating range of the CMOSFET. Furthermore, by setting at least one deep trench isolation between the two regions, the latch-up problem is effectively avoided. In the following, an embodiment is used to describe in detail the aforementioned structure.

Figure 2:
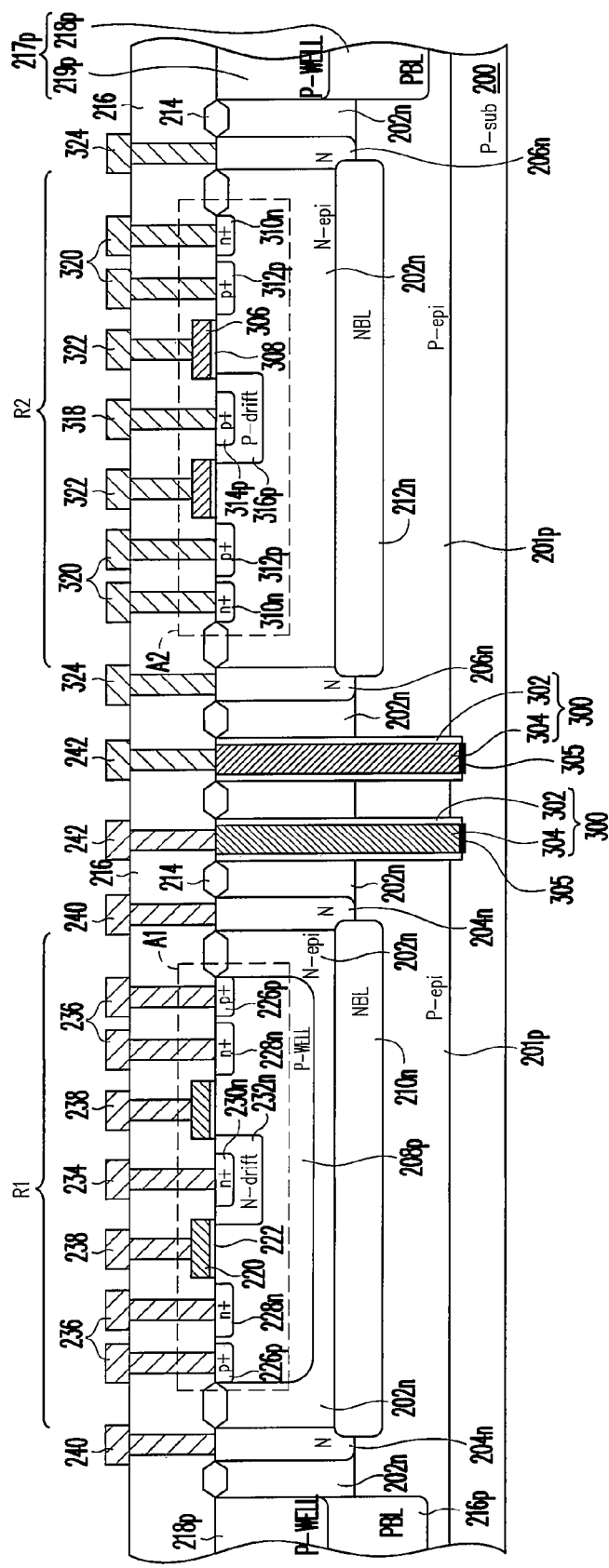
FIG. 2 is a schematic cross-sectional view of a CMOSFET according to a first embodiment of the present invention.

FIG. 2 is a schematic cross-sectional view of a CMOSFET according to a first embodiment of the present invention. As shown in FIG. 2, the CMOSFET in the present invention includes a substrate 200, a first epitaxial layer 201p, a second epitaxial layer 202n, a first sinker 204n, a second sinker 206n, a well 208p, a first transistor A1, a second transistor A2, a first buried layer 210n, a second buried layer 212n and a deep trench isolation 300. In the present embodiment, the CMOSFET further includes isolations 214, a dielectric layer 216, interconnects 234, 236, 238, 240, 242, 318, 320, 322 and 324. However, the present invention does not have to be limited in this way. The first transistor A1 and the second transistor A2 can be any types of transistors. The first transistor A1 and the second transistor A2 may be a high voltage MOSFET including the LDMOSFET, for example. In the present embodiment, the first transistor A1 and the second transistor A2 are another kind of the high voltage MOSFET. The first transistor A1 includes a gate 220, a gate dielectric layer 222, doped regions 226p, 228n, 230n and 232n. The second transistor A2 includes a gate 306, a gate dielectric layer 308, doped regions 310n, 312p, 314p and 316p. In addition, the conductivity type of the foregoing components in FIG. 2 are labeled using P-sub, P-epi, N-epi, N, PBL, NBL, P-well, n+, p+, N-drift and P-drift so that those skilled in the art can easily understand. However, these labels by no means limit the scope of the present invention. In other words, the foregoing components may have the opposite conductivity types in another embodiment. Furthermore, in the present embodiment, the first conductivity type is P-type and the second conductivity type is N-type. However, in another embodiment, the first conductivity type may be N-type while the second conductivity type may be P-type.

The substrate 200 has the first conductivity type. The first epitaxial layer 201p has the first conductivity type and is disposed on the substrate 200. The substrate 200 has a dopant concentration greater than that of the first epitaxial layer 201p, for example. If the substrate 200 is grounded, then the substrate 200 can provide a low impedance path for disposing the extra carriers produced by the first transistor A1 or the second transistor A2 in an operation. Thus, these extra carriers are prevented from affecting other semiconductor device on the substrate 200.

The second epitaxial layer 202n has the second conductivity type and is disposed on the first epitaxial layer 201p. The second epitaxial layer 202n and the first epitaxial layer 201p together form a diode. When the first transistor A1 and the second transistor A2 are in operation, the rectifying function of this diode may prevent the carriers from injecting into the first epitaxial layer 201p and the substrate 200.

The first sinker 204n has the second conductivity type and is disposed in the second epitaxial layer 202n. The first sinker 204n extends from the first epitaxial layer 201p to the upper surface of the second epitaxial layer 202n and separates a first region R1 from the second epitaxial layer 202n. On the other hand, the interconnect 240 is disposed in the dielectric layer 216 and electrically connected to the first sinker 204n. The well 208p has the first conductivity type and is disposed in the first area R1. The first transistor A1 is disposed in the well 208p. The doped region 226p of the first transistor A1 has the first conductivity type and the doped regions 228n, 230n and 232n of the first transistor A1 has the second conductivity type. The doped regions 228n, 230n, 232n are the source, the drain, the drift region of the first transistor A1 respectively. The doped regions 228n and 230n are disposed on two sides of the gate 220 and the doped region 230n is disposed in the doped region 232n. Furthermore, the interconnects 234, 238 and 236 are disposed in the dielectric layer 216 and electrically connected to the doped region 230n, the gate 220, and the doped regions 228n and 226p respectively.

The second sinker 206n has the second conductivity type and is disposed in the second epitaxial layer 202n. The second sinker 206n extends from the first epitaxial layer 201p to the upper surface of the second epitaxial layer 202n and separates a second region R2 from the second epitaxial layer 202n outside the first region R1. In addition, the interconnect 324 is disposed in the dielectric layer 216 and electrically connected to the second sinker 206n. The second transistor A2 is disposed in the second region R2. The doped region 310n of the second transistor A2 has the second conductivity type and the doped regions 312p, 314p and 316p of the second transistor A2 has the first conductivity type. The doped regions 312p, 314p, 316p are the source, the drain and the drift region of the second transistor A2 respectively. The doped regions 312p and 314p are disposed on the two sides of the gate 306 and the doped region 314p is disposed in the doped region 316p. Furthermore, the interconnects 318, 322 and 320 are disposed in the dielectric layer 216 and electrically connected to the doped region 314p, the gate 306, and the doped regions 312p and 310n respectively.

The first buried layer 210n has the second conductivity type and is disposed between the first region R1 and the first epitaxial layer 201p. The first buried layer 210n is electrically connected to the first sinker 204n. The second buried layer 212n has the second conductivity type and is disposed between the second region R2 and the first epitaxial layer 201p. The second buried layer 212n is electrically connected to the second sinker 206n. The first buried layer 210n and the second buried layer 212n are, for example, heavily doped regions. Furthermore, the dopant concentration of the first buried layer 210n and the second buried layer 212n are, for example, greater than the dopant concentration of the second epitaxial layer 202n. With the provision of the first buried layer 210n and the second buried layer 212n, the input voltage of the first transistor A1 and the second transistor A2 will not be entirely applied to the substrate 200. Thus, the acceptable range of the input voltage is increased. For example, if a high voltage is applied to the interconnect 234 or 320, then the first buried layer 210n and the second buried layer 208n can avoid an electrical breakdown at the interface between the second epitaxial layer 202n and the first epitaxial layer 201p.

Furthermore, when a high voltage is applied to the interconnect 234, the potential of the interconnect 240 is, for example, lower than that of the interconnect 234 but higher than that of the interconnect 236. Thus, the high voltage is able to directly applied to the interconnect 240 and further prevents an electrical breakdown at the interface between the second epitaxial layer 202n and the first epitaxial layer 201p. Similarly, when a high voltage is applied to the interconnect 320, the potential of the interconnect 324 is, for example, lower than that of the interconnect 320 but higher than that of the interconnect 318. Therefore, the high voltage is able to directly applied to the interconnect 324 and prevents an electrical breakdown at the interface between the second epitaxial layer 202n and the first epitaxial layer 201p. Consequently, a wider range of voltage can be applied to the interconnect 234 or the interconnect 320. It is also obvious that a wider range of voltage can be applied to the interconnects 236 and 318 as well. All in all, the first sinker 204n, the second sinker 206n, the first buried layer 210n and the second buried layer 212n can absorb the extra carriers to prevent a latch-up with other semiconductor devices on the substrate 200 while the CMOSFET is in operation. In another embodiment, the input voltages of other semiconductor devices can be prevented from interfering with the operation of the CMOSFET by adjusting the voltage of the interconnects 240 and 324.

Furthermore, by setting up the first sinker 204n, the second sinker 206n, the first buried layer 210n and the second buried layer 212n, the parasitic diode structure that comprises the doped region 312p, the second epitaxial layer 202n, the first epitaxial layer 201p, the substrate 200 and the doped region 228n is modified so that latch-up problem is prevented. More specifically, the doped region 312p, the second epitaxial layer 202n in the second region R2 and the substrate 200 together form the emitter, the base and the collector of a parasitic bipolar transistor, and the doped region 228n, the substrate 200 and the second epitaxial layer 202n in the second region R2 together form the emitter, the base and the collector of another parasitic bipolar transistor. Since the first buried layer 210n and the second buried layer 212n can be heavily doped region, the dopant concentration of the foregoing base is increased. As a result, the current gain of the bipolar transistors is lowered. Moreover, the current gain can be changed to limit latch-up by adjusting the voltage of the interconnects 240 and 324.

The deep trench isolation 300 is disposed between the first region R1 and the second region R2 and extends from the substrate 200 to the upper surface of the second epitaxial layer 202n as shown in FIG. 2. However, the present invention does not limit the number of deep trench isolation 300 and the number of deep trench isolation 300 could be one to a few. The deep trench isolation 300 is formed from the dielectric layer 302 and the isolation material 304, for example. The dielectric layer 302 is located between the isolation material 304 and the first epitaxial layer 201p and between the isolation material 304 and the second epitaxial layer 202n. The material of the dielectric layer 302 includes silicon oxide, for example. The material forming the isolation material 304 includes dielectric material, polysilicon, doped polysilicon, metal or a titanium/titanium nitride/tungsten composite structure, for example. If the isolation material 304 is not a dielectric material, then a metal silicide layer 305 might be disposed between the isolation material 304 and the substrate 200 for providing better conductivity between the isolation material 304 and the substrate 200. The material forming the metal silicide layer 305 includes, for example, titanium silicide, nickel silicide, cobalt silicide or tungsten silicide. In addition, the present invention further includes an interconnect 242 electrically connected to the isolation material 304. The dielectric layer 302 isolates the first transistor A1 from the second transistor A2. Hence, the substrate 200 is the only remaining conductive path between the first transistor A1 and the second transistor A2. Furthermore, by adjusting the voltage of the interconnect 242, the deep trench isolation 300 may absorb extra carriers in the substrate 200. By setting up the deep trench isolation 300, the CMOSFET of the present invention can prevent latch-up.

In the present embodiment, the CMOSFET of the present invention may further include a junction isolation 217p for isolating the CMOSFET from other semiconductor devices even more. The junction isolation 217p has the first conductivity type and locates between the CMOSFET and other semiconductor devices over the substrate 200. The junction isolation 217p comprises a buried layer 218p and a well 219p, for example. The buried layer 218p extends from the first epitaxial layer 201p to the second epitaxial layer 202n, and the well 219p extends from the buried layer 218p to the upper surface of the second epitaxial layer 202n. In the processing of the CMOSFET, the well 219p and the well 208p are formed simultaneously, for example.

In summary, latch-up is effectively avoided with the foregoing setup according to the present invention. In addition, the CMOSFET of the present invention can be effectively isolated from other devices and permissible range of the input voltage can be increased. Moreover, because the first sinker, the second sinker and the deep trench isolation occupy only a small portion of the available substrate area, and the first buried layer and the second buried layer are located under the first transistor and the second transistor respectively, a higher level of integration can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A complementary metal-oxide-semiconductor field effect transistor (CMOSFET), comprising:
    a substrate, having a first conductivity type;
    a first epitaxial layer, having the first conductivity type, and disposed on the substrate;
    a second epitaxial layer, having a second conductivity type, and disposed on the first epitaxial layer;
    a first sinker, having the second conductivity type, and disposed in the second epitaxial layer, wherein the first sinker extends from the first epitaxial layer to an upper surface of the second epitaxial layer, and the first sinker separates a first region from the second epitaxial layer;
    a second sinker, having the second conductivity type, and disposed in the second epitaxial layer, wherein the second sinker extends from the first epitaxial layer to the upper surface of the second epitaxial layer, and the second sinker separates a second region from the second epitaxial layer outside the first region;
    a well, having the first conductivity type, and disposed in the first region;
    a first transistor, disposed in the well;
    a second transistor, disposed in the second region;
    a first buried layer, having the second conductivity type, and disposed between the first region and the first epitaxial layer and connected to the first sinker;
    a second buried layer, having the second conductivity type, and disposed between the second region and the first epitaxial layer and connected to the second sinker; and
    a deep trench isolation, disposed between the first region and the second region, wherein the deep trench isolation extends from the substrate to the upper surface of the second epitaxial layer.

2. The CMOSFET of claim 1, wherein a material of the deep trench isolation comprises dielectric material, polysilicon, doped polysilicon, metal or a titanium/titanium nitride/tungsten composite structure.

3. The CMOSFET of claim 1, further comprising a metal silicide layer disposed between the deep trench isolation and the substrate.

4. The CMOSFET of claim 3, wherein a material of the metal silicide layer comprises titanium silicide, nickel silicide, cobalt silicide or tungsten silicide.

5. The CMOSFET of claim 1, wherein the first buried layer and the second buried layer have a dopant concentration greater than the dopant concentration of the second epitaxial layer.

6. The CMOSFET of claim 1, wherein the first transistor and the second transistor comprise high voltage metal-oxide-semiconductor field effect transistor.

7. The CMOSFET of claim 1, wherein the first conductivity type is P-type and the second conductivity type is N-type.

8. The CMOSFET of claim 1, wherein the first conductivity type is N-type and the second conductivity type is P-type.

* * * * *